(12) United States Patent
Kimura

(10) Patent No.: US 6,271,738 B1
(45) Date of Patent: Aug. 7, 2001

(54) 90° PHASE GENERATOR

(75) Inventor: Hiroyuki Kimura, Tokyo (JP)

(73) Assignee: Agere Systems Guardian Corp., Orlando, FL (US)

(*) Notice: Subject to any disclaimer, the term of this patent is extended or adjusted under 35 U.S.C. 154(b) by 0 days.

(21) Appl. No.: 09/425,703

(22) Filed: Oct. 22, 1999

(30) Foreign Application Priority Data

Oct. 22, 1998 (JP) .................................................. 10-301485

(51) Int. Cl.$^7$ ...................................................... H03D 13/00

(52) U.S. Cl. ........................... 332/103; 327/238; 375/298

(58) Field of Search ............................. 332/103; 327/223, 327/234, 235, 237, 238; 375/298; 331/12, 135

Primary Examiner—Arnold Kinkead

(57) ABSTRACT

A 90° phase generator comprises two mixers (M1.M2) whose inputs are cross-connected, a voltage controlled delay circuit (D) connected two inputs of the mixers, an integrator receiving the sum of the outputs from two mixers. The delay is maintained to 90° by controlling a control input of the voltage controlled delay circuit (D). By using the two mixers, the 90° phase generator can operate at high frequency while maintaining high accuracy.

9 Claims, 1 Drawing Sheet

90° PHASE GENERATOR

FIELD OF THE INVENTION

This invention relates to 90° phase generators.

BACKGROUND OF THE INVENTION

In the present signal modulation technique represented by mobile telephones, the method to realize accurate 90° phase generators in much higher frequency and much broader bandwidth became an important matter. In general, modulation arrangements for narrow band telecommunication systems using modulation, such as single sideband modulation (SSB), phase shift keying modulation (PSK), quadrature amplitude modulation (QAM), amplitude modulation phase modulation (AMPM), and a kind of frequency shift keying modulation (FSK), need two carrier signals having 90° phase difference.

In such arrangements, a signal from a local oscillator is passed through a 90° phase shifter to produce two quadrature phase carrier signals having 90° phase difference. I-channel signal and Q-channel signal are modulated with the quadrature phase carrier signals by the mixer to produce two signals having 90° phase difference. These two signals are combined at a power combiner and sent out through a band-pass-filter. At the receiver side, the received signal is shifted by 90° at a 90° phase shifter, and the 0° received signal and the 90° received signal are multiplied at a mixer to produce a received data.

There are two approaches for obtaining such two carrier signals having 90° phase difference, i.e., the quadrature signal waves by an integrated circuit. One method is called RC phase shifting, which utilizes a fact that if an electric current flows a serially connected circuit of a capacitor and a resistor, then the voltage across the capacitor has 90° phase difference with respect to the electric current and that the voltage across the resistor is in phase with the electric current.

The other method is called digital phase shifting, which utilizes a below fact. If we produce a signal having two times higher frequency as that of the inputted carrier signal, make it a clock signal for two T-flip flops, set one of the T-flip flops at the rising edge of the clock signal, and set the other T-flip flop at the falling edge of the clock signal, then two signal at the same frequency as the carrier signal having 90° phase difference is obtained as the output signal of each of the T-flip flops.

In the 90° phase generators of the prior art, a signal having two times higher frequency than the inputted frequency and 50% duty cycle is obtained from the output Z of a mixer, and two output signals having 90° phase difference at the same frequency as the original frequency are obtained by cascade-connected ½ frequency dividers. However, it is necessary that the output Z of the mixers have sufficient bandwidth for the two times higher frequency than the original frequency and that the ½ frequency dividers operate accurately at the frequency.

Accordingly, input frequency which is not higher than a half of the maximum operating frequency of the circuit can be used as the maximum operating frequency for the 90° phase generator. This is a drawback in the viewpoint of the current needs for high speed (FIG. 2, ISSCC98/Session 23/Paper SP23.1 p. 365).

If an ideal mixer exists and the duty cycle of its output Z can be 50%, the phase difference of its inputs X and Y would be 90°. Therefore it would be possible to make a 90° phase generator without ½ frequency dividers. However, in actual circuits, the phase errors in the input X and Y of the mixer do not have the necessary accuracy. Therefore, the circuit shown in FIG. 2 has been used in actual.

We will explain the invention using mathematical equations. If an ideal mixer was used (assuming that it exists), then its operation is written as follows.

$$Z = X \cdot Y,$$

where, X and Y are the inputs, and Z is the output.

X and Y have the magnitude of 1 and the same frequency, but a different phase. Following expression can be used for X and Y.

$$X = \cos(\omega t)$$

$$Y = \cos(\omega t + \phi),$$

where, $\omega$ is the angular frequency, t is the time, and $\phi$ is the phase difference between X and Y. The output is:

$$Z = \cos(\omega t) \cdot \cos(\omega t + \phi)$$

$$= \frac{1}{2} \cdot \{\cos(\phi) + \cos(2\omega t + \phi)\}.$$

The dc component $Z_{dc}$ is:

$$Z_{dc} = \frac{1}{2} \cdot \cos(\phi)$$

If $\phi = 90°$, $Z_{dc}$ is 0, and the integrated value of Z is substantially constant. Therefore, the delay of voltage controlled delay circuit becomes constant.

However, in an actual mixer, a relative delay error ($\theta_e$) exists between X and Y. Considering the operation of the mixer, the actual output Z' is expressed as follows.

$$Z' = \cos(\omega t) \cdot \cos(\omega t + \phi + \theta_e)\}$$

$$= \frac{1}{2} \cdot \{\cos(\phi + \theta_e) + \cos(2\omega t + \phi + \theta_e)\}$$

Its dc component $Z'_{dc}$ is:

$$Z_{dc} = \frac{1}{2} \cdot \cos(\phi + \theta_e).$$

When $\phi = 90° - \theta_e$ (i.e., when shifted by the amount of the phase error between the input X and Y of the mixer), as is aforementioned, the output of the voltage controlled delay circuit becomes constant, and the output of the 90° phase generator will be a value including the error of $\theta_e$.

Accordingly, in a 90° phase generator using a conventional mixer, there is a problem on its operating frequency or its accuracy.

The purpose of the present invention is to eliminate the disadvantage of such a conventional circuit and easily implement a 90° phase generator which can operate at higher frequency while maintaining high accuracy.

SUMMARY OF THE INVENTION

A 90° phase generator according to the present invention comprises a first mixer (M1) that receives input signal ($\cos(\omega t)$) at a first input (X1), a second mixer (M2) that receives an input signal ($\cos(\omega t)$) at a second input (Y2), and a integrator (S) that integrates the summed signal of the outputs of the first mixer (M1) and the second mixer (Y2) that was added in an adder Σ. The first mixer (M1) and the second mixer (Y2) have substantially identical characteristics. Also, the 90° phase generator includes a voltage controlled delay circuit (D), which provides the phase difference (φ) to input signal to its generate a delayed signal (cos(ωt)) and supplies the delayed signal to the second input (Y1) of the first mixer (M1) and the first input (X2) of the second mixer (M2). The output signal from the integrator (S) controls the phase difference (φ) given by the voltage controlled delay circuit (D).

In such an arrangement, when the two outputs of the 90° phase generator have an accurate 90° phase difference (i.e., φ=90°), the dc component of the output of the adder Σ will be 0, and therefore the output of the integrator S becomes constant. The delay time of the voltage controlled delay circuit D will also be constant, because it is controlled by its control input C, i.e., the output of the integrator S. Thus, the phase difference φ in the outputs of the 90° phase generator is kept 90°.

When the two outputs of the 90° phase generator is shifted from 90° difference, the value of the dc component of the output of the adder Σ increases, and accordingly the output of the integrator S changes. In response to the change in the output of the integrator S, the delay time of the voltage controlled delay circuit D also changes, and the phase difference φ is adjusted to 90°.

The two times higher frequency of the input frequency and the dc component of the phase difference are generated from the sum of the outputs of the mixers M1 and M2. Also, only the dc component of mixer output is utilized in the succeeding integrator. Therefore, a small gain of the mixer at the two times higher frequency of the input frequency will be acceptable, if the frequency is in the effective range of the mixer. For this reason, a 90° phase generator according to the present invention can operate at a higher frequency which the prior art could not achieve while maintaining high accuracy in phase.

DETAILED DESCRIPTION

Figure 1:
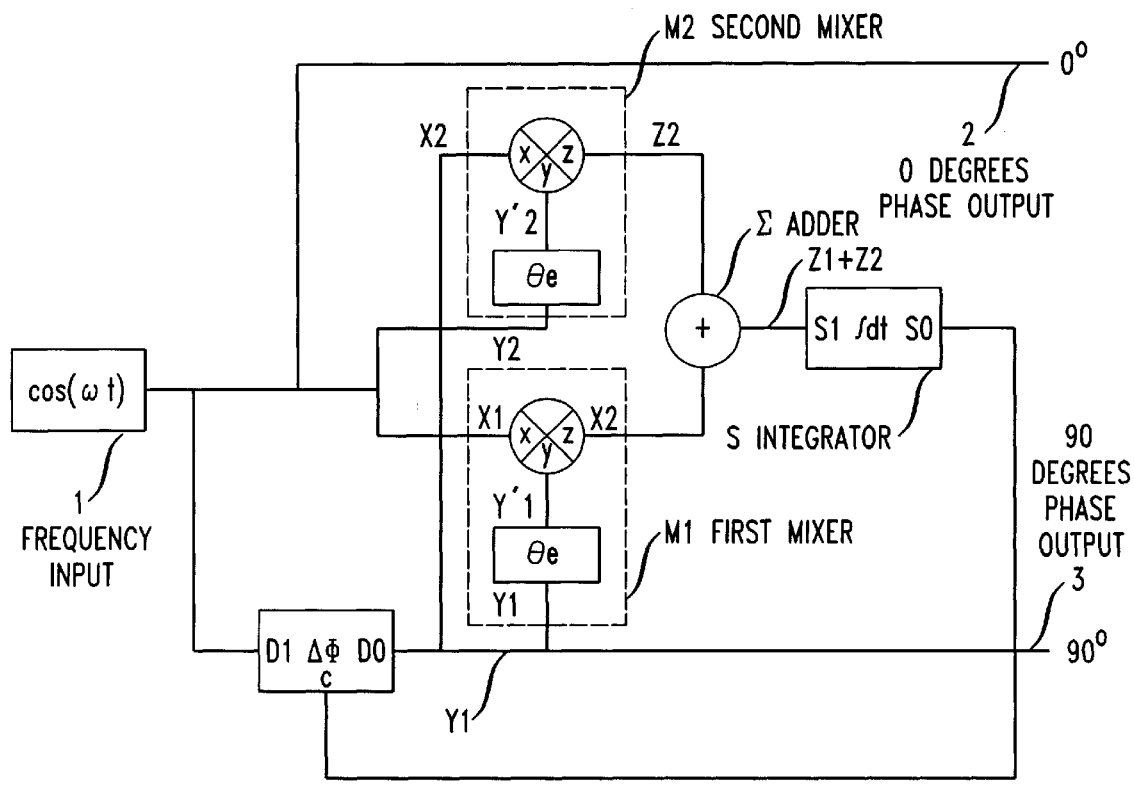
FIG. 1 is a block diagram of a 90° phase generator according to a embodiment of the present invention.
Figure 2:
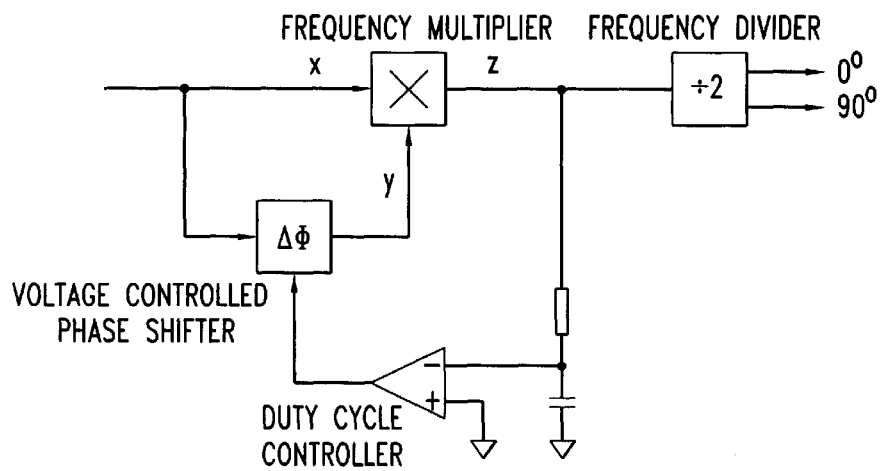
FIG. 2 is a block diagram of an exemplary 90° phase generator according to the prior art.

A 90° phase generator according to a embodiment of the present invention will be explained referring to the drawings. In FIG. 1, a frequency input 1 is supplied to the 90° phase generator. M1 and M2 are the mixers, which have respectively two inputs X1, Y1 and X2, Y2, and one output Z1, Z2. The mixers M1 and M2 have the same characteristics, the relative error in the phases of the input X1 and the input Y1 and the relative error in the phases of the input X2 and the input Y2 are respectively represented by $\theta_e$. The frequency input 1 is supplied to the mixer input X1 and Y2 respectively.

The two mixer outputs Z1 and Z2 are supplied to an adder Σ, the output of the adder Σ is supplied to an integrator S as its input SI. The frequency input 1 is supplied to a voltage controlled delay circuit D as its input DI. The output SO of the integrator S is supplied as its control input C, and delays the frequency input 1 depending on the magnitude of the control input C to produce its output DO. The output DO of the voltage controlled delay circuit D is supplied to the mixers M1 and M2 as their inputs Y1 and X2. The frequency input 1 is supplied to the first input 2 of the 90° phase generator as it is, and the output DO of the voltage controlled delay circuit D is supplied to the second input 3.

Next, we will discuss the operation of the above described 90° phase generator according to an embodiment of the present invention. The frequency input 1 (cos(ωt)) is respectively supplied to two mixers M1 and M2, whose characteristics are matched. Specifically, the frequency input 1 (cos(ωt)) is supplied to the first input X1 of the mixer M1 and the second input Y2 of the mixer M2, where ω represents the angular frequency, t represents the time.

The output DO of the voltage controlled delay circuit D is supplied to the second input Y1 of the mixer M1 and the first input X2 of the mixer M2. The output DO of the voltage controlled delay circuit D is represented as (cos(ωt+φ)), the voltage controlled delay circuit D varies the delay time ?φ according to the magnitude of its control input C, and control so that the phase difference is maintained to be 90°.

The inputs of the mixers M1 and M2 are expressed as follows. The input of mixer M1 is:

$$X1=\cos(\omega t),\ Y1=\cos(\omega t+\phi)$$

The input of mixer M2 is:

$$X2=\cos(\omega t+\phi),\ Y2=\cos(\omega t)$$

Since the characteristics of the mixers M1 and M2 are the same, assuming that the mixers M1 and M2 have necessarily the same phase error $\theta_e$, $$Y'1=\cos(\omega t+\phi+\theta_e)$$

$$Y'2=\cos(\omega t+\theta_e)$$

In the mixers M1 and M2, the operation of the next equation is performed.

$$Z=X \cdot Y'$$

In the mixer M1, $$Z1 = X1 \cdot Y'1$$
$$= \cos(\omega t) \cdot \cos(\omega t + \phi + \theta_e)$$
$$= \frac{1}{2} \cdot \{\cos(\phi + \theta_e) + \cos(2\omega t + \phi + \theta_e)\}$$

In the mixer M2, $$Z2 = X2 \cdot Y'2$$
$$= \cos(\omega t + \phi) \cdot \cos(\omega t + \theta_e)$$
$$= \frac{1}{2} \cdot \{\cos(\phi + \theta_e) + \cos(2\omega t + \phi + \theta_e)\}$$

The output Z1 of the mixer M1 and the output Z2 of the mixer M2 are supplied to the two inputs of the adder Σ. As a result, the output of the adder Σ, i.e., the sum of Z1 and Z2, is given as the following.

$$Z1 + Z2 = \frac{1}{2} \cdot \{\cos(\phi + \theta_e) + \cos(2\omega t + \phi + \theta_e)\} +$$

-continued $$\frac{1}{2} \cdot \{\cos(\phi - \theta_e) + \cos(2\omega t + \phi \theta_e)\}$$

$$= \frac{1}{2} \cdot \{\cos(\phi + \theta_e) + \cos(\phi + \theta_e)\} + \cos(2\omega t + \phi + \theta_e)$$

$$= \cos(\phi) \cdot \cos(\theta_e) + \cos(2\omega t + \phi + \theta_e)$$

Its dc component $(Z1+Z2)_{dc}$ is:

$$(Z1+Z2)_{dc} = \cos(\phi) \cdot \cos(\theta_e)$$

When the two inputs 2 and 3 of the 90° phase generator have an accurate 90° phase difference (i.e., φ=90°), since cos(90°)=0, the dc component of the output from adder Σ becomes 0. Therefore, the output SO of the integrator S becomes constant. Furthermore, the delay time Δφ of the voltage controlled delay circuit D becomes constant, since the voltage controlled delay circuit D is controlled by its control input C (i.e., the output SO of the integrator S). Thus, the phase difference φ of the inputs from the 90° phase generator is maintained to 90°.

When the phase difference φ of the inputs 2 and 3 shifts from 90° difference, the value of the dc component cos(φ)·cos(θ$_e$) of the output of the adder Σ becomes greater. Accordingly, the output SO of the integrator S changes. In response to the change in the output SO of the integrator S, the delay time φ of the voltage controlled delay circuit D changes to adjust the time difference φ to 90° difference.

Considering when the range of the relative phase error is $-90° < \theta_e < +90°$, it is cos(θ$_e$)>0. Therefore, the dc component $(Z1+Z2)_{dc}$ is in direct proportion to cos(φ) and has the same sign as cos(φ). Thus, if the relative phase error θ$_e$ of each input of mixers M1 and M2 is less than 90°, the errors appearing at respective output Z1 and Z2 cause attenuation of the dc component when summed, but the effect of the phase difference will be canceled.

The sum of the outputs of mixers M1 and M2 produce the two times higher frequency than the input frequency and the dc component as the phase difference, and only the dc component of the mixer output is utilized at the succeeding integrator. Therefore, the gain of the mixer can be lower at the two times higher frequency than that of its input if the mixer can operate sufficiently at the frequency.

As the 90° phase generator according to the present invention is constituted as described in the above, it is possible to operate at higher frequency than conventional 90° phase generators while maintaining high accuracy in phase.

What is claimed is:

1. A phase generator, comprising:
   a delay circuit (D) for generating from an input signal (cos(ωt)) a delayed signal (cos(ωt+φ)) having a phase difference (φ) with respect to the input signal, the phase difference controlled by a control signal;
   a first mixer having first and second input terminals for receiving as respective inputs the input signal and the delayed signal, the first mixer for mixing the signals received at the first and second input terminals and providing a first mixer output; and
   a second mixer, substantially identical to the first mixer, the second mixer having first and second terminals for receiving as respective inputs the delayed signal and the input signal, the second mixer for mixing the signals received at the first and second terminals and providing a second mixer output, the first mixer output and the second mixer output forming the control signal.

2. A phase generator as recited in claim 1, wherein, a phase error (θ$_e$) introduced in the first mixer is identical to a phase error (θ$_e$) introduced in the second mixer.

3. A phase generator as recited in claim 1, wherein the control signal is comprised of the sum of the first mixer output and the second mixer output.

4. A phase generator as recited in claim 3, further comprising,
   an integrator (S) for integrating the sum of the two mixer outputs to produce an integrator output, the integrator output being the control signal.

5. A phase generator as recited in claim 4, further comprising,
   an adder (Σ) for adding the first mixer output and second mixer output to produce an adder output, the adder output providing an input to the integrator (S).

6. A phase generator as recited in claim 2, wherein the phase errors (θ$_e$) are greater than −90° and less than +90°.

7. A phase generator as recited in claim 1, wherein the phase difference (φ) produced is 90°.

8. A phase generator, comprising:
   a first mixer (M1) having first and second input terminals, the first mixer for receiving an input signal (cos(ωt+φ)) at the first input terminal thereof and producing an output;
   a second mixer (M2) having first and second input terminals, the second mixer being substantially identical to the first mixer, the second mixer for receiving the input signal at the second input terminal thereof and providing an output;
   an integrator (S) for receiving and integrating the outputs from the first mixer (M1) and the second mixer (M2) and producing an integrator output; and
   a voltage controlled delay circuit for receiving the input signal, the voltage controlled delay circuit generating a delayed signal (cos(ωt+φ)) having a predetermined phase difference (φ) with respect to the input signal, and providing the delayed signal to a second input terminal of the first mixer (M1) and the first input terminal of the second mixer (M2), wherein the phase difference (φ) provided by the voltage controlled delay circuit is controlled by the integrator (S) output.

9. A phase generator as recited in claim 8, wherein the predetermined phase difference (φ) produced is 90°.

* * * * *